(12) United States Patent
Chen et al.

(10) Patent No.: US 12,278,302 B2
(45) Date of Patent: *Apr. 15, 2025

(54) SOLAR CELL AND METHOD FOR PRODUCING THE SAME

(71) Applicants: ZHEJIANG JINKO SOLAR CO., LTD., Zhejiang (CN); JINKO SOLAR CO., LTD., Jiangxi (CN)

(72) Inventors: Yifan Chen, Zhejiang (CN); Wenqi Li, Zhejiang (CN); Minghui Xie, Zhejiang (CN); Guochun Zhang, Zhejiang (CN)

(73) Assignees: ZHEJIANG JINKO SOLAR CO., LTD., Zhejiang (CN); JINKO SOLAR CO., LTD., Jiangxi (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/399,623

(22) Filed: Dec. 28, 2023

(65) Prior Publication Data

US 2024/0413257 A1     Dec. 12, 2024

Related U.S. Application Data

(63) Continuation of application No. 18/454,670, filed on Aug. 23, 2023.

(30) Foreign Application Priority Data

Jun. 8, 2023   (CN) .......................... 202310678819.2

(51) Int. Cl.
  *H01L 31/054*   (2014.01)
  *H01L 31/0236*   (2006.01)
  *H01L 31/18*   (2006.01)

(52) U.S. Cl.
  CPC ........ *H01L 31/054* (2014.12); *H01L 31/0236* (2013.01); *H01L 31/186* (2013.01)

(58) Field of Classification Search
  CPC ........... H01L 31/02168; H01L 31/0236; H01L 31/022441; H01L 31/054; H01L 31/18; H01L 31/1868; H01L 31/186
  See application file for complete search history.

(56) References Cited

U.S. PATENT DOCUMENTS 9,735,310 B2   8/2017   Bailly
11,404,597 B2   8/2022   Koike et al.
(Continued)

FOREIGN PATENT DOCUMENTS

CN   115084299 A   9/2022
CN   115347073 A   11/2022
(Continued)

OTHER PUBLICATIONS

Zhejiang Jinko Solar Co., Ltd., et al., Extended European Search Report, EP 23192962.1, Feb. 16, 2024, 8 pgs.
(Continued)

*Primary Examiner* — Mayla Gonzalez Ramos
(74) *Attorney, Agent, or Firm* — USCH Law, PC

(57) ABSTRACT

Embodiments of the present disclosure relate to a solar cell and a method for producing the same. The solar cell includes: a substrate having a first textured surface, a plurality of sheet-shaped anti-reflection films, and a plurality of grid lines. A plurality of grid-line areas spaced from each other are formed on the first textured surface, and each grid-line area has a second textured surface. One or more sheet-shaped anti-reflection films of the plurality of sheet-shaped anti-reflection films are formed on a portion of the second textured surface of each grid-line area. Each grid line of the plurality of grid lines is formed on a respective grid-line area, and each grid line is in contact with the one or more sheet-shaped anti-reflection films and with a remaining portion of the second textured surface of the (Continued)

respective grid-line area not covered by any sheet-shaped anti-reflection films. grid linegrid line.

20 Claims, 5 Drawing Sheets

(56) References Cited

U.S. PATENT DOCUMENTS

| | | | |
|---|---|---|---|
| 2010/0229917 A1* | 9/2010 | Choi | H01L 31/0682 136/244 |
| 2013/0255777 A1 | 10/2013 | Lee et al. | |
| 2013/0319517 A1* | 12/2013 | Lee | H01L 31/0224 438/98 |
| 2013/0340822 A1* | 12/2013 | Nam | H01L 31/1804 136/256 |
| 2014/0099747 A1 | 4/2014 | Jin et al. | |
| 2018/0158968 A1 | 6/2018 | Lee et al. | |
| 2018/0198017 A1* | 7/2018 | Koike | H01L 31/03762 |
| 2022/0102568 A1 | 3/2022 | Yang et al. | |
| 2022/0165906 A1 | 5/2022 | Chen et al. | |

FOREIGN PATENT DOCUMENTS

| | | |
|---|---|---|
| CN | 115528130 A | 12/2022 |
| JP | 2014505376 A | 2/2014 |
| JP | 2016006907 A | 1/2016 |
| JP | 2020098929 A | 6/2020 |
| KR | 20160025222 A | 3/2016 |
| KR | 20200021378 A | 2/2020 |
| WO | 2011045287 A1 | 4/2011 |
| WO | 2015147225 A1 | 10/2015 |

OTHER PUBLICATIONS

Zhejiang Jinko Solar Co., Ltd., et al., Notice of Allowance, U.S. Appl. No. 18/454,670, filed Oct. 5, 2023, 10 pgs.
1 Zhejiang Jinko Solar Co., Ltd., et al. Non Final Rejection, U.S. Appl. No. 18/454,670, filed Jun. 6, 2024, 28 pgs.

* cited by examiner

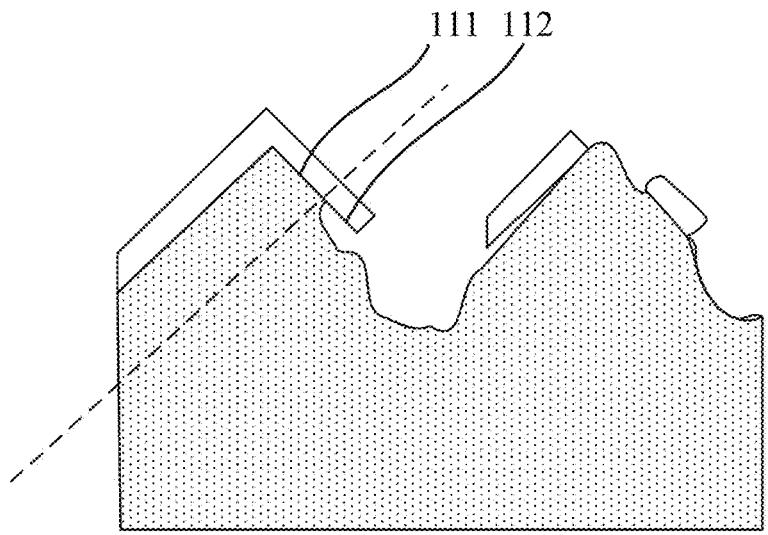

FIG. 7

A substrate having a first textured surface is provided, the first textured surface has a plurality of first pyramid structures, and an anti-reflection film is formed on the first textured surface A laser treatment process is performed on the anti-reflection film, to form a plurality of grid-line areas spaced from each other and a plurality of sheet-shaped anti-reflection films, each grid-line area of the plurality of grid-line areas has a second textured surface, one or more respective sheet-shaped anti-reflection films of the plurality of sheet-shaped anti-reflection films are formed on a portion of the second textured surface of each respective grid-line area, and a remaining portion of the second textured surface of each respective grid-line area is not covered by any sheet-shaped anti-reflective films A plurality of grid lines is formed, each grid line of the plurality of grid lines is formed on a respective grid-line area and is in contact with the one or more sheet-shaped anti-reflection films formed on a portion of the second textured surface of the respective grid-line area and with the remaining portion of the second textured surface of the respective grid-line area not covered by any sheet-shaped anti-reflection films

FIG. 8

SOLAR CELL AND METHOD FOR PRODUCING THE SAME

CROSS REFERENCE TO RELATED APPLICATIONS

The present application is a continuation of U.S. patent application Ser. No. 18/454,670, filed on Aug. 23, 2023, which claims the benefit of priority under the Paris Convention to Chinese Patent Application No. 202310678819.2 filed on Jun. 8, 2023, each of which is incorporated herein by reference in its entirety.

TECHNICAL FIELD

Embodiments of the present disclosure relate to the field of solar cells technology, and in particular to a solar cell and a method for producing solar cells.

BACKGROUND

Fossil energy causes air pollution and has limited reserves, while solar energy has the advantages of clean, pollution-free and rich resources. Thus, solar energy is gradually becoming the core clean energy in place of fossil energy. Because solar cells have good photoelectric conversion efficiency, the solar cells gradually become the focus of development of clean energy.

During usage of the solar cells, sunlight enters each solar cell through a surface of each solar cell, photo-generated carriers are generated in each solar cell by light-energy conversion, and are collected and transferred through grid lines formed on the surface of each solar cell. In this way, conversion and utilization of solar energy to electrical energy can be achieved. During production of the solar cells, grid lines may be formed on the surface of each solar cell using electroplating processes. However, bonding between grid lines and a solar cell slice of an existing solar cell is weak, and the grid lines are likely to detach from the solar cell slice.

SUMMARY

Embodiments of the present disclosure provide a solar cell and a method for producing solar cells, which are at least conducive to improvement of the bonding strength between grid lines and solar cell slices, and to reduction of the probability of detachment of the grid lines.

Some embodiments of the present disclosure provide a solar cell, including: a substrate having a first textured surface, a plurality of sheet-shaped anti-reflection films, and a plurality of grid lines. The first textured surface has a plurality of first pyramid structures, and a plurality of grid-line areas spaced from each other are formed on the first textured surface. Each grid-line area of the plurality of grid-line areas has a second textured surface. One or more sheet-shaped anti-reflection films of the plurality of sheet-shaped anti-reflection films are formed on a portion of the second textured surface of each grid-line area of the plurality of grid-line areas. Each grid line of the plurality of grid lines is formed on a respective grid-line area, and each grid line is in contact with one or more sheet-shaped anti-reflection films formed on a portion of a second textured surface of the respective grid-line area and with a remaining portion of the second textured surface of the respective grid-line area not covered by any sheet-shaped anti-reflection films.

In some embodiments, each grid-line area of the plurality of grid-line areas includes a first portion, a second portion and a third portion in sequence along a direction perpendicular to an extension direction of a grid-line area, and the first portion, the second portion and the third portion each have a plurality of projected structures. The one or more sheet-shaped anti-reflection films of the plurality of sheet-shaped anti-reflection films are formed on at least a part of the plurality of projected structures of the first portion and on at least a part of the plurality of projected structures of the third portion.

In some embodiments, no sheet-shaped anti-reflection film is formed on the plurality of projected structures of the second portion. The plurality of projected structures of the first portion and the plurality of projected structures of the third portion are second pyramid structures or pyramid-like structures, and the plurality of projected structures of the second portion are pine-cone structures.

In some embodiments, in a direction perpendicular to the first textured surface, a ratio of a height of a respective one of the plurality of projected structures of the second portion to a height of a respective one of the plurality of first pyramid structures of the first textured surface ranges from 0.3 to 0.9.

In some embodiments, the one or more sheet-shaped anti-reflection films of the plurality of sheet-shaped anti-reflection films are formed also on at least a part of the plurality of projected structures of the second portion.

In some embodiments, a largest size in any one dimension of a respective sheet-shaped anti-reflection film of the plurality of sheet-shaped anti-reflection films ranges from 0.3 μm to 6 μm.

In some embodiments, the largest size in any one dimension of the respective sheet-shaped anti-reflection film of the plurality of sheet-shaped anti-reflection films ranges from 2 μm to 6 μm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.4 to 0.9.

In some embodiments, the largest size in any one dimension of the respective sheet-shaped anti-reflection film of the plurality of sheet-shaped anti-reflection films ranges from 0.3 μm to 2 μm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.6 to 1.

In some embodiments, a distance between each two adjacent sheet-shaped anti-reflection films of the one or more sheet-shaped anti-reflection films ranges from 20 nm to 5 μm.

In some embodiments, a surface of a respective one of the plurality of sheet-shaped anti-reflection films facing towards the second textured surface includes a bonding region with the second textured surface and a suspended region without contact with the second textured surface.

In some embodiments, in a direction perpendicular to the surface of the respective one sheet-shaped anti-reflection film facing towards the second textured surface, a distance between the suspended region and the second textured surface ranges from 50 nm to 1000 nm.

In some embodiments, a ratio of an area of the suspended region to an area of the surface of the respective one sheet-shaped anti-reflection film facing towards the second textured surface ranges from 5% to 90%.

In some embodiments, a thickness of a respective one of the plurality of sheet-shaped anti-reflection films in a direction perpendicular to a surface of the respective one sheet-shaped anti-reflection film facing towards the second textured surface ranges from 40 nm to 600 nm.

In some embodiments, a length of a lateral side of a respective one of the plurality of first pyramid structures ranges from 400 nm to 5 μm.

Some embodiments of the present disclosure provide a method for producing a solar cell, including: providing a substrate having a first textured surface, where the first textured surface has a plurality of first pyramid structures, a plurality of grid-line areas spaced from each other are formed on the first textured surface, each grid-line area of the plurality of grid-line areas has a second textured surface, and a respective anti-reflection film is formed on the second textured surface; performing a laser treatment process on the respective anti-reflection film of each grid-line area, to form one or more sheet-shaped anti-reflection films on the second textured surface of each grid-line area, where the one or more sheet-shaped anti-reflection films expose a portion of the second textured surface of each grid-line area; and forming a respective grid line on each grid-line area, where the respective grid line is in contact with the second textured surface of each grid-line area and with the one or more sheet-shaped anti-reflection films.

In some embodiments, in the laser treatment process, a laser spot is formed on the respective anti-reflection film of each grid-line area, and a center region of the laser spot has a size d, the laser spot has a moving velocity v, laser used in the laser treatment process has frequency f, and $0.8d < v/f < 2d$.

In some embodiments, laser used in the laser treatment process forms a laser spot on the respective anti-reflection film of each grid-line area, and a ratio of a size of a center region of the laser spot to a size of the laser spot ranges from 0.4 to 0.6 or from 0 to 0.1.

In some embodiments, performing the laser treatment process on the respective anti-reflection film of each grid-line area, includes: performing a plurality of laser treatments on the respective anti-reflection film of each grid-line area using the laser, where the ratio of the size of the center region of the laser spot to the size of the laser spot ranges from 0 to 0.1.

In some embodiments, after the one or more sheet-shaped anti-reflection films are formed on the second textured surface of each grid-line area, the method further includes: performing deoxidation treatment on each grid-line area using slow-release hydrofluoric acid with concentration of 0.3% to 20%.

In some embodiments, a duration of the deoxidation treatment ranges from 20 seconds to 90 seconds.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

FIG. 7 is a partial cross-section view of a solar cell according to some embodiments of the present disclosure.

FIG. 8 is a flow chart of a method for producing solar cells according to some embodiments of the present disclosure.

DETAILED DESCRIPTION OF THE EMBODIMENTS

Figure 1:
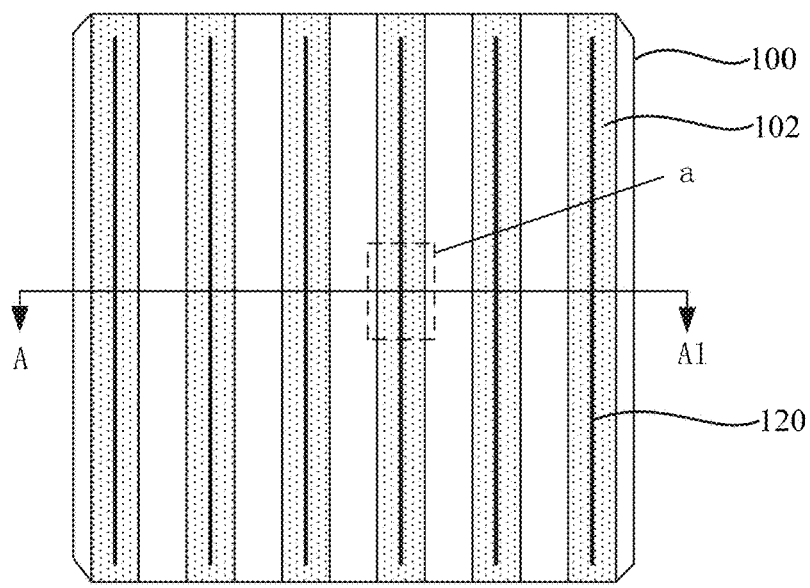
FIG. 1 is a top view of a solar cell according to some embodiments of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It can be known from the background art that during production of the existing solar cells, grid lines may be formed on the surface of each solar cell using electroplating processes. However, contact areas between grid lines and a respective solar cell are small, and bonding strength is low, so that the grid lines are likely to detach from the respective solar cell. Conventionally, electrochemical methods are used to improve the bonding force between different plating layers, so that the bonding force between different plating layers of a grid line can be improved as much as possible, thereby preventing detachment between different plating layers of the grid line, and reducing the probability of detachment of the grid line. However, the bonding force between the grid line and the substrate is not effectively improved yet.

Some embodiments of the present disclosure provide a solar cell, in which a plurality of grid-line areas each having a second textured surface are formed on the first textured surface of the substrate of the solar cell. The second textured surface of a respective grid-line area greatly increases the contact area between a respective grid line and the substrate, thereby improving the bonding strength between the respective grid line and the substrate to some extent. One or more sheet-shaped anti-reflection films are formed on a portion of the second textured surface of a respective grid-line area. The one or more sheet-shaped anti-reflection films are in tight contact with the second textured surface, and a large number of gaps from which the second textured surface is exposed are formed between adjacent sheet-shaped anti-reflection films. Each grid line is formed to be in contact with the exposed parts of the second textured surface of the respective grid-line area and with the one or more sheet-shaped anti-reflection films. Because each sheet-shaped anti-reflection film has a thickness, the formed grid line is also in contact with lateral surfaces of each sheet-shaped anti-reflection film, thereby further increasing the contact area between the formed grid line and the substrate. Moreover, because the one or more sheet-shaped anti-reflection films are in tight contact with the substrate, the one or more sheet-shaped anti-reflection films play a role of anchoring structures, thereby greatly improving the bonding strength between the respective grid line and the substrate, reducing the probability of detachment of the respective grid line, and improving the reliability of the solar cell.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Figure 2:
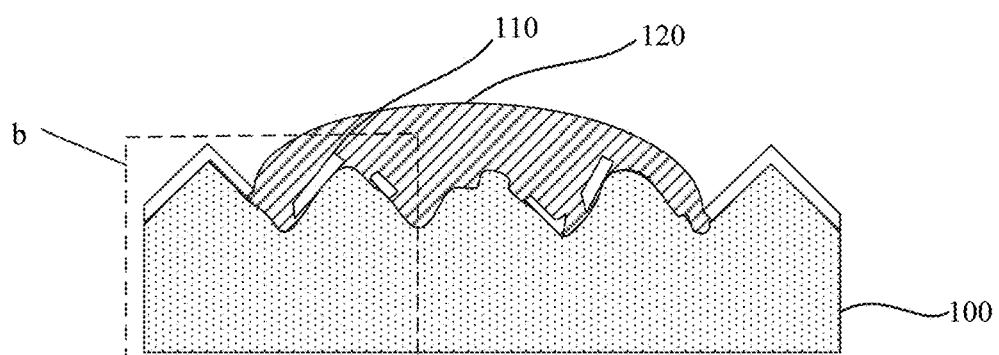
FIG. 2 is a cross-section view of a solar cell according to some embodiments of the present disclosure.
Figure 3:
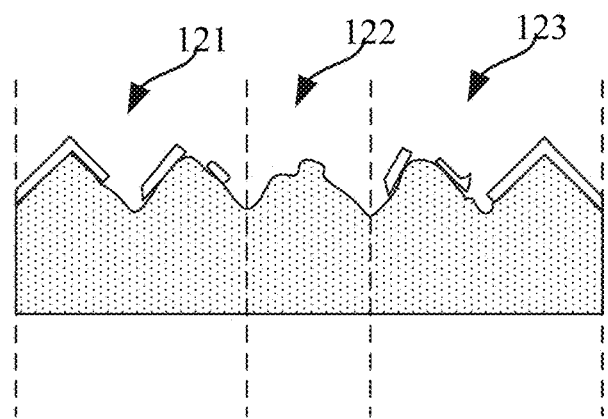
FIG. 3 is a partial cross-section view of a solar cell according to some embodiments of the present disclosure.
Figure 4:
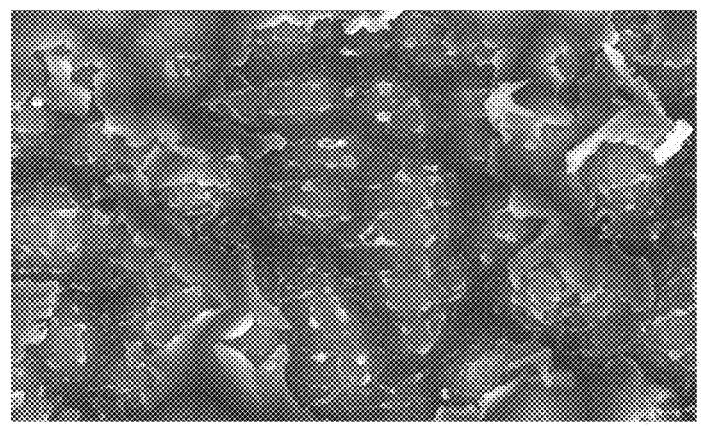
FIG. 4 is a partial top view of a grid-line area according to some embodiments of the present disclosure.
Figure 5:
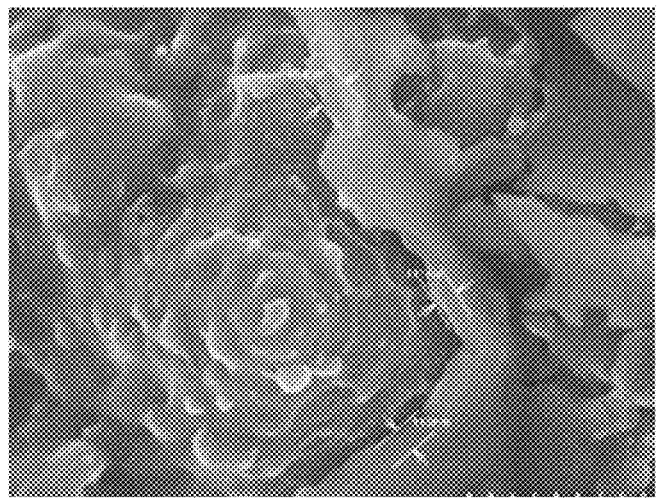
FIG. 5 is a top view of a part of a structure of the second textured surface according to some embodiments of the present disclosure.
Figure 6:
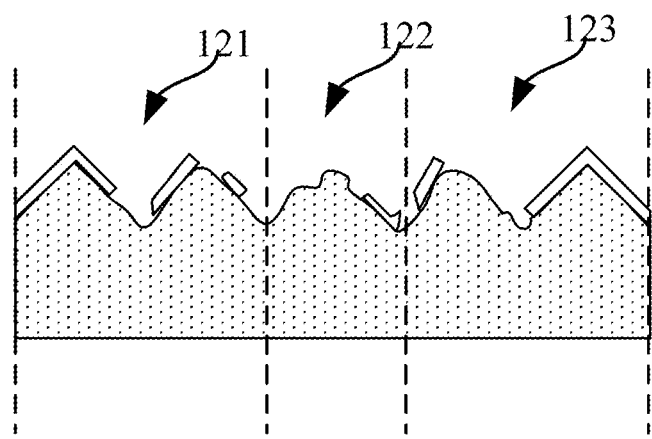
FIG. 6 is a partial cross-section view of another solar cell according to some embodiments of the present disclosure.

Some embodiments of the present disclosure provide a solar cell. Referring to FIGS. 1 to 6, FIG. 1 is a top view of the solar cell, FIG. 2 is a cross-section view of the solar cell along the AA line, FIG. 3 is a cross-section view of a grid-line area 102 whose a second portion 122 has no sheet-shaped anti-reflection film 110, FIG. 4 is a partial top view of the grid-line area 102, FIG. 5 is a top view of a projected structure of the second portion 122, and FIG. 6 is a cross-section view of a grid-line area 102 whose a second portion 122 also has a sheet-shaped anti-reflection film 110.

The solar cell includes: a substrate 100 having a first textured surface, a plurality of sheet-shaped anti-reflection films 110, and a plurality of grid lines 120. The first textured surface has a plurality of first pyramid structures, and a plurality of grid-line areas 102 spaced from each other are formed on the first textured surface. Each grid-line area 102 of the plurality of grid-line areas 102 has a second textured surface. One or more sheet-shaped anti-reflection films 110 of the plurality of sheet-shaped anti-reflection films 110 are formed on a portion of the second textured surface of each grid-line area 102 of the plurality of grid-line areas 102, and the one or more sheet-shaped anti-reflection films 110 expose a portion of the second textured surface of each grid-line area 102. Each grid line 120 of the plurality of grid lines 120 is formed on a respective grid-line area 102, and each grid line 120 is in contact with one or more sheet-shaped anti-reflection films 110 formed on a portion of a second textured surface of the respective grid-line area 102 and with a remaining portion of the second textured surface of the respective grid-line area 102 not covered by any sheet-shaped anti-reflection films 110.

During production of a solar cell, a plurality of grid-line areas 102 spaced from each other and each having a second textured surface are formed. In this way, a surface area of a respective grid-line area 102 can be greatly increased, thereby increasing the contact area between a grid line 120 formed on the respective grid-line area 102 and the substrate 100, and improving the bonding strength between the formed grid line 120 and the substrate 100 to some extent. One or more sheet-shaped anti-reflection films 110 are formed on a portion of the second textured surface of a respective grid-line area 102, and the one or more sheet-shaped anti-reflection films 110 expose a portion of the second textured surface. Each grid line 120 is formed to be in contact with the exposed parts of the second textured surface of the respective grid-line area and with the one or more sheet-shaped anti-reflection films 110. The formed grid line 120 is in contact with lateral surfaces of each sheet-shaped anti-reflection film 110, thereby further increasing the contact area and the bonding strength between the formed grid line 120 and the substrate 100. Moreover, because the one or more sheet-shaped anti-reflection films 110 are in tight contact with the substrate 100, the one or more sheet-shaped anti-reflection films 110 play a role of anchoring structures, thereby greatly improving the bonding strength between the respective grid line 120 and the substrate 100, reducing the probability of detachment of the respective grid line 120 from the substrate 100, and improving the reliability of the solar cell.

In some embodiments, the substrate 100 may be a substrate made from semiconductor, such as silicon, germanium, germanium silicon, or silicon on an insulator. The material of the substrate 100 may be an elemental semiconductor material. Specifically, elemental semiconductor materials are composed of a single element, such as silicon or germanium. The elemental semiconductor materials may be in a single crystal state, a polycrystalline state, an amorphous state, or a microcrystalline state (in the single crystal and amorphous states concurrently). For example, silicon may be at least one of monocrystalline silicon, polycrystalline silicon, amorphous silicon, or microcrystalline silicon. When the material of the substrate is silicon, the material of the substrate 100 may include at least one of monocrystalline silicon, polycrystalline silicon, amorphous silicon, or microcrystalline silicon. The material of the substrate 100 may also be a compound semiconductor material. For example, silicon germanide, silicon carbide, gallium arsenide, indium gallide, perovskite, cadmium telluride, and copper indium diselenide or the like. The material of the substrate 100 may also be silicon carbide, organic materials or polycompounds.

In some embodiments, the substrate 100 may be a substrate made from N-type semiconductor or P-type semiconductor. The substrate made from N-type semiconductor is doped with N-type doping elements, which may be any one of the V-group elements such as phosphorus (P), bismuth (Bi), antimony (Sb), or arsenic (As). The substrate made from P-type semiconductor is doped with P-type elements, which may be any one of the III-group elements such as boron (B), aluminum (Al), gallium (Ga), or gallium (In).

In some embodiments, each grid-line area 102 of the plurality of grid-line areas 102 includes a first portion 121, a second portion 122 and a third portion 123 in sequence along a direction perpendicular to an extension direction of a grid-line area 102, and the first portion 121, the second portion 122 and the third portion 123 each have a plurality of projected structures. The one or more sheet-shaped anti-reflection films 110 of the plurality of sheet-shaped anti-reflection films 110 are formed on at least a part of the plurality of projected structures of the first portion 121 and on at least a part of the plurality of projected structures of the third portion 123.

During production of the solar cell, before forming the plurality of grid lines 120, selective etching may be carried out on the first textured surface to form the plurality of grid-line areas 102. Each grid-line area 102 includes a first portion 121, a second portion 122 and a third portion 123 in sequence along the direction perpendicular to the extension direction of a grid-line area 102. By the selective etching, one or more sheet-shaped anti-reflection films 110 are formed on the first portion 121 and the third portion 123. When forming the plurality of grid lines 120, the contact area of a respective grid line 120 with the substrate 100 includes areas of lateral surfaces of the one or more sheet-shaped anti-reflection films 110 formed on the first portion 121 and the third portion 123. In this way, the contact area can be increased, the bonding strength between the plurality of grid lines 120 and the substrate 100 can be improved, and the probability of detachment of the plurality of grid lines 120 from the substrate 100 can be reduced.

It should be understood that during the selective etching, etching may be performed on only the first portion 121 and the third portion 123, so that some of the plurality of projected structures of the first portion 121 and of the plurality of projected structures of the third portion 123 are completely covered by anti-reflection films, and some of the plurality of projected structures of the first portion 121 and of the plurality of projected structures of the third portion 123 have the one or more sheet-shaped anti-reflection films 110 on them. The selective etching may be selective laser etching or selective chemical etching. The specific method of the selective etching is not limited in the embodiments of the present disclosure.

In some embodiments, no sheet-shaped anti-reflection film 110 is formed on the plurality of projected structures of the second portion 122. The plurality of projected structures of the first portion 121 and the plurality of projected structures of the third portion 123 are second pyramid structures or pyramid-like structures, and the plurality of projected structures of the second portion 122 are pine-cone structures.

During production of the solar cell, a plurality of first pyramid structures or pyramid-like structures are be formed all over the first textured surface of the substrate 100, thereby effectively improving the trapping ability of light trapping structures. After performing the selective etching on the first textured surface, a part of the anti-reflection film covering the first textured surface is removed, to form the second textured surface of a respective grid-line area and the one or more sheet-shaped anti-reflection films 110 on the first portion 121 and the third portion 123 of the respective grid-line area. The part of the anti-reflection film covering the second portion 122 is completely removed, and the first pyramid structures or pyramid-like structures of the second portion 122 are partially etched, to formed the plurality of projected structures of the second portion 122 which are pine-cone structures. The partial structure of a grid-line area 102 is shown in FIG. 4, and a pine-cone structure is shown in FIG. 5.

The one or more sheet-shaped anti-reflection films 110 formed on at least a part of the plurality of projected structures of the first portion 121 and on at least a part of the plurality of projected structures of the third portion 123 can effectively increase the contact area and bonding strength between a respective grid line 120 and the substrate 100. The respective grid line 120 can directly contact with the exposed part of the substrate 100 in the second portion 122, thereby reducing the contact resistance between the respective grid line 120 and the substrate 100 and the loss in carriers collected by the respective grid line 120, and improving the photoelectric conversion efficiency of the solar cell. Moreover, by transforming the first pyramid structures or pyramid-like structures into the pine-cone structures, the layered protrusions of each pine-cone structure can further increase the contact area between the respective grid line 120 and substrate 100, improve the contact strength and reduce the contact resistance between the respective grid line 120 and substrate 100.

After the selective etching, the plurality of projected structures of the second portion 122 may have no sheet-shaped anti-reflection film on them, or a part of the plurality of projected structures of the second portion 122 may have sheet-shaped anti-reflection films on them. In a case where at least a part of the plurality of projected structures of the second portion have sheet-shaped anti-reflection films on them, the plurality of projected structures of the second portion are not of the shape of pine cone, but of a shape approximate to the pyramid shape of the plurality of projected structures of the first portion and the plurality of projected structures of the third portion. In this case, the damage to the anti-reflection film formed on the substrate 100 caused by production of the plurality of grid lines 120 can be reduced, thereby improving the photoelectric conversion efficiency of the solar cell.

In some embodiments, in a direction perpendicular to the first textured surface, a ratio of a height of a respective one of the plurality of projected structures of the second portion to a height of a respective one of the plurality of first pyramid structures of the first textured surface ranges from 0.3 to 0.9.

In the direction perpendicular to the first textured surface, a height of a projected structure refers to a distance between a vertex of the projected structure farthest from the first textured surface and the first textured surface. During the selective removal of the anti-reflection film covering the first textured surface, in order to make the plurality of projected structures of the second portion 122 to have no sheet-shaped anti-reflection films on them, damage may be caused on the plurality of projected structures of the second portion, which may influence the ratio of the height of a respective projected structure of the second portion 122 to the height of a respective first pyramid structure of the first textured surface.

When the ratio is too low, it is indicated that the plurality of projected structures of the second portion 122 and therefore the substrate 100 are excessively etched, which causes excessive voltage loss of the solar cell. Moreover, the excessively etched plurality of projected structures of the second portion may cause decrease in the contact area between the respective grid line 120 and the substrate 100, thereby affecting the bonding strength between the respective grid line 120 and the substrate 100. When the ratio is too high, it is indicated that the plurality of projected structures of the second portion 122 are insufficiently etched, and there may be remaining sheet-shaped anti-reflection films on the plurality of projected structures of the second portion 122. Thus, the contact resistance between the respective grid line 120 and the substrate 100 is relatively high, thereby causing decrease in carrier collection efficiency of the solar cell.

In view of this, the ratio of the height of a respective one of the plurality of projected structures of the second portion 122 to the height of a respective one of the plurality of first pyramid structures of the first textured surface may be valued from 0.3 to 0.9, for example, 0.35, 0.4, 0.45, 0.5, 0.6, 0.75, 0.8, 0.85, or the like. In this way, the damage to the substrate 100 caused by production of the plurality of grid lines 120 can be reduced, excessive voltage loss of the solar cell can be prevented, the contact resistance between the plurality of grid lines 120 and the substrate 100 can be reduced, and the carrier collection ability and the photoelectric conversion efficiency of the solar cell can be improved.

It should be understood that a part of the plurality of projected structures of the second portion 122 may have sheet-shaped anti-reflection films 110 on them. Thus, the height of a respective one of the plurality of projected structures of the second portion 122 may refer to an average height or a maximum height of the plurality of projected structures of the second portion 122. Similarly, the height of a respective one of the plurality of first pyramid structures of the first textured surface may refer to an average height or a maximum height of the plurality of first pyramid structures of the first textured surface.

In some embodiments, the one or more sheet-shaped anti-reflection films 110 of the plurality of sheet-shaped anti-reflection films 110 are formed also on at least a part of the plurality of projected structures of the second portion 122.

After performing the selective etching on the anti-reflection film formed on the first textured surface, at least a part of the plurality of projected structures of the first portion 121, at least a part of the plurality of projected structures of the second portion 122 and at least a part of the plurality of projected structures of the third portion 123 may have the one or more sheet-shaped anti-reflection films 110 on them, which can be seen in FIG. 6.

In this way, the contact area between the plurality of grid lines 120 and the substrate 100 can be greatly increased. The one or more sheet-shaped anti-reflection films 110 formed on the first, second and third portions play a role of anchoring structures, thereby greatly improving the bonding strength between the plurality of grid lines 120 and the substrate 100, reducing the loss in open-circuit voltage, and improving the photoelectric conversion efficiency.

In some embodiments, a largest size in any one dimension of a respective sheet-shaped anti-reflection film 110 of the plurality of sheet-shaped anti-reflection films 110 ranges from 0.3 µm to 6 µm.

After performing the selective etching on the anti-reflection film formed on the first textured surface, when the formed plurality of sheet-shaped anti-reflection films 110 have excessive sizes, it is indicated that the substrate subjected to excessive damage caused by the selective etching, which may lead to relatively high loss in open-circuit voltage and relatively great damage on the anti-reflection film, thereby affecting the photoelectric conversion efficiency of the solar cell. When the formed plurality of sheet-shaped anti-reflection films 110 have too small sizes, the bonding strength between the plurality of sheet-shaped anti-reflection films 110 and the substrate 100 is insufficient, which may lead to detachment of sheet-shaped anti-reflection films 110, thereby increasing the probability of detachment of the plurality of grid lines 120. Herein, the largest size in any one dimension of the respective sheet-shaped anti-reflection film 110 refers to a maximum distance between any two points on a surface of the respective sheet-shaped anti-reflection film 110.

In view of this, the largest size in any one dimension of the respective sheet-shaped anti-reflection film 110 of the plurality of sheet-shaped anti-reflection films 110 may be valued from 0.3 µm to 6 µm, for example, 0.35 µm, 0.4 µm, 0.5 µm, 0.75 µm, 1 µm, 1.25 µm, 1.5 µm, 2 µm, 2.5 µm, 3 µm, 3.75 µm, 4.5 µm, 5.5 µm, or the like. In this way, the loss in open-circuit voltage and damage on the anti-reflection film of the solar cell can be reduced, and the photoelectric conversion efficiency of the solar cell can be improved. Moreover, the bonding strength between the plurality of sheet-shaped anti-reflection films 110 and the substrate 100 can be secured, thereby improving the bonding strength between the plurality of grid lines 120 and the substrate 100, and reducing the probability of detachment of the plurality of grid lines 120.

In some embodiments, the largest size in any one dimension of the respective sheet-shaped anti-reflection film 110 of the plurality of sheet-shaped anti-reflection films 110 ranges from 2 µm to 6 µm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.4 to 0.9.

In the direction perpendicular to the first textured surface, a height of a projected structure refers to a distance between a vertex of the projected structure farthest from the first textured surface and the first textured surface. The sizes of the plurality of sheet-shaped anti-reflection films 110 formed by selective etching are related to the height of a respective one of the plurality of projected structures of the first portion, or of the plurality of projected structures of the second portion, or of the plurality of projected structures of the third portion. Conventionally, the larger the sizes of the plurality of sheet-shaped anti-reflection films 110, the greater the etching degree on the anti-reflection film, and the greater the damage on the first textured surface. By adjusting the etching process, the plurality of sheet-shaped anti-reflection films 110 having sizes ranged from 2 µm to 6 µm are formed, such as sheet-shaped anti-reflection films 110 having sizes of 2.5 µm, 3 µm, 3.75 µm, 4.5 µm, 5.5 µm, or 5.8 µm. Moreover, the ratio of the height of a respective one of the plurality of projected structures of the first portion, or of the plurality of projected structures of the second portion, or of the plurality of projected structures of the third portion to the height of a respective one of the plurality of first pyramid structures of the first textured surface may be valued from 0.4 to 0.9, for example, 0.45, 0.5, 0.55, 0.65, 0.75, 0.8, or the like. Herein, the largest size in any one dimension of the respective sheet-shaped anti-reflection film 110 refers to a maximum distance between any two points on a surface of the respective sheet-shaped anti-reflection film 110.

It should be understood that the height of a respective one of the plurality of projected structures of the first portion, or of the plurality of projected structures of the second portion, or of the plurality of projected structures of the third portion may refer to an average height or a maximum height of the projected structures having the one or more sheet-shaped anti-reflection films 110 on them. Similarly, the height of a respective one of the plurality of first pyramid structures of the first textured surface may refer to an average height or a maximum height of the plurality of first pyramid structures of the first textured surface.

By setting the largest size in any one dimension of the respective sheet-shaped anti-reflection film in a range of 2 µm to 6 µm, and setting the ratio of a height of a respective projected structure of the first, second or third portion to the height of a respective first pyramid structure of the first textured surface in a range of 0.4 to 0.9, the formed plurality of sheet-shaped anti-reflection films 110 are in a form of randomly distributed large blocks, which effectively increases the bonding strength between the plurality of sheet-shaped anti-reflection films 110 and the substrate 100. Moreover, the plurality of sheet-shaped anti-reflection films 110 can expose relatively many parts of the substrate 100, thereby increasing the contact area between the plurality of grid lines 120 and the substrate 100, reducing the contact resistance between the plurality of grid lines 120 and the substrate 100, and reducing the loss in carrier collected by the plurality of grid lines 120.

In some embodiments, the largest size in any one dimension of the respective sheet-shaped anti-reflection film 110 of the plurality of sheet-shaped anti-reflection films 110 ranges from 0.3 μm to 2 μm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.6 to 1.

After performing the selective etching on the anti-reflection film formed on the first textured surface, the plurality of sheet-shaped anti-reflection films 110 having sizes ranged from 0.3 μm to 2 μm are formed, such as sheet-shaped anti-reflection films 110 having sizes of 0.35 μm, 0.5 μm, 0.75 μm, 1 μm, 1.5 μm, or 1.75 μm. Moreover, in the direction perpendicular to the first textured surface, the ratio of the height of a respective one of the plurality of projected structures of the first portion, or of the plurality of projected structures of the second portion, or of the plurality of projected structures of the third portion to the height of a respective one of the plurality of first pyramid structures of the first textured surface may be valued from 0.6 to 1, for example, 0.625, 0.65, 0.7, 0.75, 0.825, 0.95, or the like. Herein, the largest size in any one dimension of the respective sheet-shaped anti-reflection film 110 refers to a maximum distance between any two points on a surface of the respective sheet-shaped anti-reflection film 110, and in the direction perpendicular to the first textured surface, the height of a respective projected structure refers to a distance between a vertex of the respective projected structure farthest from the first textured surface and the first textured surface.

By setting the largest size in any one dimension of the respective sheet-shaped anti-reflection film in a range of 0.3 μm to 2 μm, and setting the ratio of a height of a respective projected structure of the first, second or third portion to the height of a respective first pyramid structure of the first textured surface in a range of 0.6 to 1, the formed plurality of sheet-shaped anti-reflection films 110 are in a form of uniformly distributed small blocks, which decreases exposing area of the substrate 100, thereby reducing the damage to the anti-reflection film and the loss in open-circuit voltage of the solar cell, and improving the photoelectric conversion efficiency of the solar cell. Moreover, the sum of areas of the lateral surfaces of the sheet-shaped anti-reflection films 110 can be increased, thereby increasing the contact area and bonding strength of the plurality of grid lines 120 and the substrate 100, and reducing the probability of detachment of the plurality of grid lines 120.

Similarly, the height of a respective one of the plurality of projected structures of the first portion, or of the plurality of projected structures of the second portion, or of the plurality of projected structures of the third portion may refer to an average height or a maximum height of the projected structures having one or more sheet-shaped anti-reflection films 110 on them, and the height of a respective one of the plurality of first pyramid structures of the first textured surface may refer to an average height or a maximum height of the plurality of first pyramid structures of the first textured surface.

In some embodiments, a distance between each two adjacent sheet-shaped anti-reflection films 110 of the one or more sheet-shaped anti-reflection films 110 ranges from 20 nm to 5 μm.

The distance between each two adjacent sheet-shaped anti-reflection films 110 refers to a minimum distance between a point on a sheet-shaped anti-reflection films 110 and another point on an adjacent sheet-shaped anti-reflection film 110. The distance between adjacent sheet-shaped anti-reflection films 110 is related to the area of the substrate exposed by the adjacent sheet-shaped anti-reflection films 110, and the area of the substrate exposed by the adjacent sheet-shaped anti-reflection films 110 is positively correlated with the distance between adjacent sheet-shaped anti-reflection films 110 with other conditions unchanged.

The distance between adjacent sheet-shaped anti-reflection films 110 is related to the etching degree on the anti-reflection film. The greater the etching degree, the larger the distance between the adjacent sheet-shaped anti-reflection films 110. When the distance between adjacent sheet-shaped anti-reflection films 110 is too large, the substrate and the anti-reflection film subject to relatively great damage, and the preservation of the plurality of first pyramid structures is poor, thereby causing excessive loss in open-circuit voltage of the solar cell, and affecting the photoelectric conversion efficiency of the solar cell. When the distance between adjacent sheet-shaped anti-reflection films 110 is too small, the exposed area of the substrate is relatively small, thereby causing excessive contact resistance between the plurality of grid lines 120 and the substrate 100, and excessive loss in collection of carriers in the solar cell.

In view of this, the distance between each two adjacent sheet-shaped anti-reflection films 110 may be set to be in a range of 20 nm to 5 μm, such as 25 nm, 35 nm, 50 nm, 75 nm, 100 nm, 150 nm, 200 nm, 275 nm, 350 nm, 500 nm, 750 nm, 1 μm, 1.25 μm, 1.5 μm, 2 μm, 2.5 μm, 3.5 μm, 4.5 μm, or the like. In this way, the damage to the anti-reflection film and the loss in open-circuit voltage of the solar cell can be reduced as much as possible, the contact resistance between the plurality of grid lines 120 and the substrate 100 and the loss in collection of carriers can be reduced, and the photoelectric conversion efficiency of the solar cell can be improved.

Referring to FIGS. 1 to 7, in some embodiments, a surface of a respective one of the plurality of sheet-shaped anti-reflection films 110 facing towards the second textured surface includes a bonding region 111 with the second textured surface and a suspended region 112 without contact with the second textured surface. FIG. 7 is a partial enlarged view of the region b in FIG. 2.

One of the functions of the plurality of sheet-shaped anti-reflection films 110 is to improve the bonding strength between the plurality of grid lines 120 and the substrate 100. When the surface of a respective one of the plurality of sheet-shaped anti-reflection films 110 facing towards the second textured surface tightly bonds with the second textured surface, the bonding strength between the plurality of grid lines 120 and the substrate 100 can be improved because the total contact area between the plurality of grid lines 120 and the substrate is increased. When the surface facing towards the second textured surface includes the bonding region 111 with the second textured surface and the suspended region 112 without contact with the second textured surface, each grid line of the formed plurality of grid lines 120 includes parts formed between respective suspended regions 112 and the second textured surface. In this way, each sheet-shaped anti-reflection film 110 can further anchor a respective grid line 120 through the part corresponding to the suspended regions 112, thereby further improving the bonding strength between the plurality of grid lines 120 and the substrate 100, and reducing the probability of detachment of the plurality of grid lines 120 as much as possible.

It should be understood that each sheet-shaped anti-reflection film of the plurality of sheet-shaped anti-reflection films 110 may include the bonding region 111 and the suspended region 112, or a part of the plurality of sheet-shaped anti-reflection films 110 may include the bonding regions 111 and the suspended regions 112.

In some embodiments, in a direction perpendicular to the surface of the respective one sheet-shaped anti-reflection film 110 facing towards the second textured surface, a distance between the suspended region 112 and the second textured surface ranges from 50 nm to 1000 nm.

In the direction perpendicular to the surface of the respective one sheet-shaped anti-reflection film 110 facing towards the second textured surface, the distance between the suspended region 112 and the second textured surface refers to a minimum distance between any point on the suspended region 112 and the second textured surface. When the distance between the suspended region 112 and the second textured surface is too small, the part of a respective grid line 120 formed between the suspended region 112 and the second textured surface has an excessively small thickness, causing the part of the respective grid line 120 to be likely to fracture when the respective grid line 120 undergoes deformation or torsion under an external force, thereby leading to that the respective one sheet-shaped anti-reflection film 110 can no longer anchor the respective grid line 120 through the part corresponding to the suspended regions 112, and the bonding strength between the respective grid line 120 and the substrate 100 degrades. When the distance between the suspended region 112 and the second textured surface is too large, the part of the respective grid line 120 formed between the suspended region 112 and the second textured surface has an excessively large thickness, bubbles or holes are likely to occur during the formation, causing an increased resistivity of the respective grid line 120 and therefore increased contact resistance between the respective grid line 120 and the substrate 100. Thus, the carrier collection ability of the respective grid line 120 degrades, the damage to the substrate is relatively severe, and the solar cell has an excessive loss in open-circuit voltage and affected photoelectric conversion ability.

In view of this, in the direction perpendicular to the surface of the respective one sheet-shaped anti-reflection film 110 facing towards the second textured surface, the distance between the suspended region 112 and the second textured surface may be set in a range of 50 nm to 1000 nm, such as 55 nm, 65 nm, 80 nm, 100 nm, 125 nm, 150 nm, 200 nm, 250 nm, 325 nm, 400 nm, 500 nm, 650 nm, 750 nm, 850 nm, 975 nm, or the like. In this way, the bonding strength between the respective grid line 120 and the substrate 100 can be effectively improved, the resistivity of the respective grid line 120 and the loss in open-circuit voltage of the solar cell can be reduced, the probability of detachment of the respective grid line 120 can be reduced, and the carrier collection ability of the respective grid line 120 and the photoelectric conversion efficiency of the solar cell can be improved.

It should be understood that the distances between different suspended regions 112 and the second textured surface may differ from each other or may be the same, which is not specifically limited in the embodiments of the present disclosure.

In some embodiments, a ratio of an area of the suspended region 112 to an area of the surface of the respective one sheet-shaped anti-reflection film 110 facing towards the second textured surface ranges from 5% to 90%.

The strength of a part of a respective grid line 120 formed between the suspended region 112 and the second textured surface is related to not only the distance between the suspended region 112 and the second textured surface, i.e. a thickness of the part of the respective grid line 120 formed between the suspended region 112 and the second textured surface, but also the ratio of the area of the suspended region 112 to the area of the surface of the respective one sheet-shaped anti-reflection film 110 facing towards the second textured surface. When the ratio is too low, most of the respective one sheet-shaped anti-reflection film 110 tightly bonds with the second textured surface, and a volume between the suspended region 112 and the second textured surface is too small. Thus, the force preventing the respective grid line 120 from detaching is limited, and the bonding strength between the respective grid line 120 and the substrate 100 cannot be effectively increased. When the ratio is too high, the contact area between the respective one sheet-shaped anti-reflection film 110 and the second textured surface and therefore the bonding strength between the respective one sheet-shaped anti-reflection film 110 and the substrate 100 are limited. Thus, the respective one sheet-shaped anti-reflection film 110 is prone to detach from the substrate 100, and the bonding strength between the respective grid line 120 and the substrate 100 cannot be effectively increased.

In view of this, the ratio of the area of the suspended region 112 to the area of the surface of the respective one sheet-shaped anti-reflection film 110 facing towards the second textured surface may be set in a range of 5% to 90%, such as 6%, 7.5%, 9%, 10%, 12.5%, 15%, 20%, 25%, 35%, 50%, 60%, 75%, 80%, 85%, or the like. In this way, the bonding strength between the respective one sheet-shaped anti-reflection film 110 and the substrate 100 can be sufficient, the bonding strength between the respective grid line 120 and the substrate 100 can be effectively improved, and the ability of the respective one sheet-shaped anti-reflection film 110 that prevents detachment of the respective grid line 120 can be improved, thereby reducing the probabilities of detachment of the respective one sheet-shaped anti-reflection film 110 and the respective grid line 120.

Moreover, the larger the proportion of the area of the suspended area 112, the larger the contact area of the respective grid line 120 with the second textured surface. By setting the proportion of the area of the suspended area 112 in a suitable range, not only the bonding strength between the respective grid line 120 and the substrate 100, but also the contact area of the respective grid line 120 with the substrate 100 can be effectively increased, thereby reducing the contact resistance between the respective grid line 120 and the substrate 100, improving the carrier collection ability of the respective grid line 120, and reducing the loss in collection of carriers.

In some embodiments, a thickness of a respective one of the plurality of sheet-shaped anti-reflection films 110 in a direction perpendicular to a surface of the respective one sheet-shaped anti-reflection film 110 facing towards the second textured surface ranges from 40 nm to 600 nm.

The thickness of a respective one sheet-shaped anti-reflection film 110 refers to a distance between the surface of the respective one sheet-shaped anti-reflection film 110 facing towards the second textured surface and a surface of the respective one sheet-shaped anti-reflection film 110 facing away from the second textured surface. When the thickness is too small, anti-reflection ability of the respective one sheet-shaped anti-reflection film 110 and areas of the lateral surfaces of the respective one sheet-shaped anti-reflection film 110 are limited, thus the contact area of the respective grid line 120 with the substrate 100 cannot be effectively increased. When the thickness is too large, the production cost of the respective one sheet-shaped anti-reflection film 110 is too high. Furthermore, in order to make the respective grid line 120 to contact with the second textured surface, the volume of raw materials for the respective grid line 120 has to greatly increase, and the production cost of the respective grid line 120 accordingly increases.

In view of this, the thickness of the respective one of the plurality of sheet-shaped anti-reflection films 110 in the direction perpendicular to the surface of the respective one sheet-shaped anti-reflection film 110 facing towards the second textured surface is set in a range of 40 nm to 600 nm, such as 45 nm, 50 nm, 60 nm, 75 nm, 90 nm, 100 nm, 125 nm, 150 nm, 180 nm, 200 nm, 225 nm, 275 nm, 350 nm, 400 nm, 475 nm, 550 nm, 585 nm, or the like. In this way, the bonding strength and the contact area between the respective grid line 120 and the substrate 100 can be effectively increased, the production cost of the plurality of sheet-shaped anti-reflection films and the plurality of grid lines 120 can be reduced.

It should be understood that the thicknesses of the plurality of sheet-shaped anti-reflection films 110 may be different from each other or be the same, which is not specifically limited in the embodiments of the present disclosure.

In some embodiments, a length of a lateral side of a respective one of the plurality of first pyramid structures ranges from 400 nm to 5 µm. The plurality of first pyramid structures can effectively improve the light trapping ability of the solar cell. By setting the length of the lateral side of the respective one first pyramid structure in a range of 400 nm to 5 µm, such as 450 nm, 500 nm, 575 nm, 650 nm, 750 nm, 900 nm, 1000 nm, 1.2 µm, 1.25 µm, 1.5 µm, 2 µm, 2.75 µm, 3.5 µm, 4.5 µm, or the like, the surface area of the first textured surface can be effectively increased, thereby increasing the bonding strength and the contact area between the respective grid line 120 and the substrate 100. Moreover, the heights of the plurality of first pyramid structures can be controlled by the lengths of the lateral sides of the plurality of first pyramid structures, in order to increase the thicknesses of the plurality of grid lines 120 in the direction perpendicular to the first textured surface, thereby reducing transport resistance for the carriers in the plurality of grid lines 120.

It should be understood that lengths of the lateral sides of different first pyramid structures may be different from each other or be the same.

Some embodiments of the present disclosure provide a solar cell, in which a plurality of grid-line areas 102 each having a second textured surface are formed on the first textured surface of the substrate of the solar cell. The second textured surface of a respective grid-line area 102 greatly increases the contact area between a respective grid line 120 and the substrate 100, thereby improving the bonding strength between the respective grid line 120 and the substrate 100 to some extent. One or more sheet-shaped anti-reflection films 110 are formed on a portion of the second textured surface of a respective grid-line area 102. The one or more sheet-shaped anti-reflection films 110 are in tight contact with the second textured surface, and a large number of gaps from which the second textured surface is exposed are formed between adjacent sheet-shaped anti-reflection films 110. Each grid line 120 is formed to be in contact with the exposed parts of the second textured surface of the respective grid-line area and with the one or more sheet-shaped anti-reflection films 110. Because each sheet-shaped anti-reflection film 110 has a thickness, the formed grid line 120 is also in contact with lateral surfaces of each sheet-shaped anti-reflection film 110, thereby further increasing the contact area between the formed grid line 120 and the substrate 100. Moreover, because the one or more sheet-shaped anti-reflection films 110 are in tight contact with the substrate 100, the one or more sheet-shaped anti-reflection films 110 play a role of anchoring structures, thereby greatly improving the bonding strength between the respective grid line 120 and the substrate 100, reducing the probability of detachment of the respective grid line 120, and improving the reliability of the solar cell.

Some embodiments of the present disclosure further provide a method for producing a solar cell, applicable to production apparatus for the solar cells. The production process of the solar cells may be referred to FIG. 8.

Figure 9:
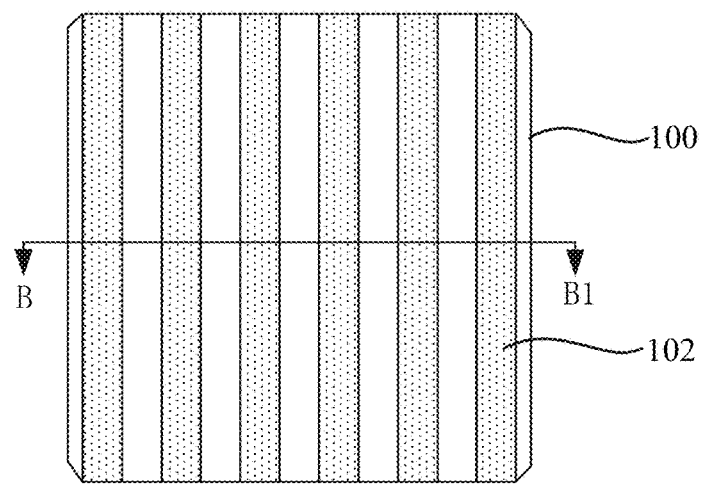
FIG. 9 is a top view of a substrate according to some embodiments of the present disclosure.
Figure 10:
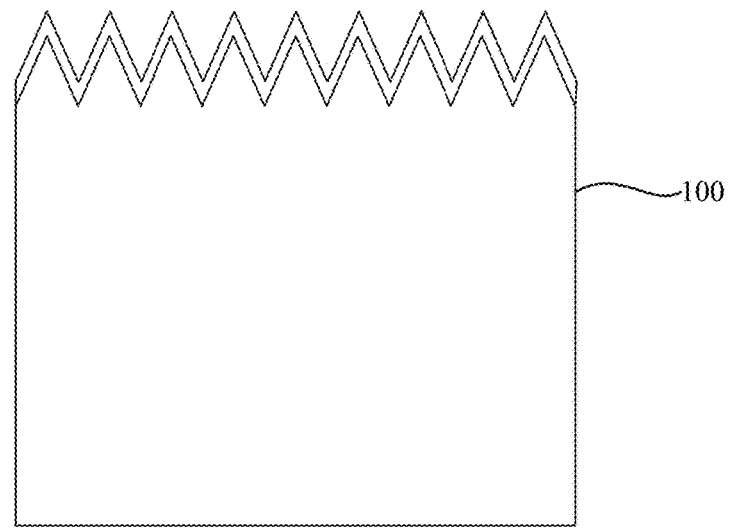
FIG. 10 is a cross-section view of a substrate according to some embodiments of the present disclosure.
Figure 11:
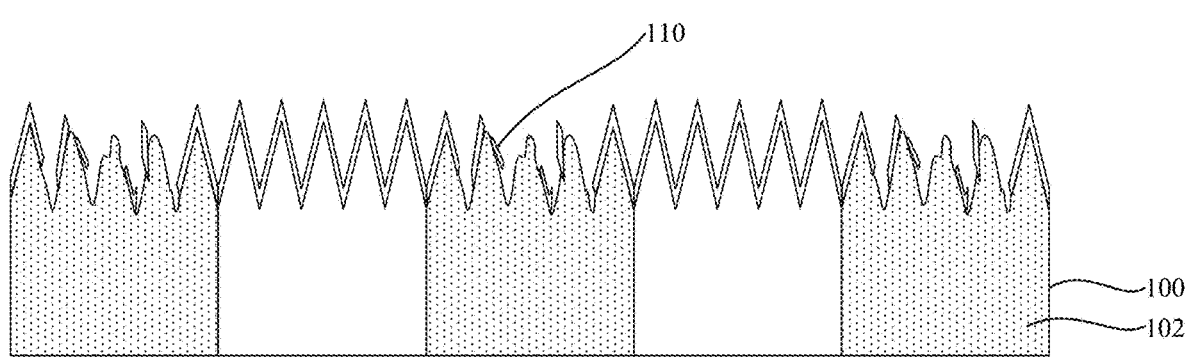
FIG. 11 is a cross-section view of a half-finished solar cell according to some embodiments of the present disclosure.

Referring to FIGS. 8 and 11, a substrate 100 having a first textured surface is provided. The first textured surface has a plurality of first pyramid structures. A plurality of grid-line areas 102 spaced from each other are formed on the first textured surface, each grid-line area of the plurality of grid-line areas 102 has a second textured surface, and a respective anti-reflection film is formed on the second textured surface. FIG. 9 is a top view of the first textured surface of the substrate 100, FIG. 10 is a cross-section view of the substrate 100 along the BB1 direction, and FIG. 11 is a partial cross-section view of the substrate 100, where selective etching has been performed on the anti-reflection film.

During production of the solar cell, the substrate 100 is provided first, where a first surface of the substrate has been pre-textured to obtain the first textured surface, and the anti-reflection film has been formed on the first textured surface.

In some embodiments, the plurality of first pyramid structures are a plurality of pyramid protrusions or pyramid-like protrusions, which can effectively improve the light absorption capacity of the solar cell. Moreover, the plurality of pyramid structures or pyramid-like structures also have a certain converging effect on laser, which is conducive to the subsequent selective etching performed on the anti-reflection film.

In some embodiments, the anti-reflection film includes a layer of anti-reflection material, or includes two or more layers of anti-reflection materials different from each other and stacked in sequence. The anti-reflection materials include silicon dioxide, silicon nitride, titanium dioxide, zirconia and the like.

A laser treatment process is performed on the respective anti-reflection film on each grid-line area 102, to form one or more sheet-shaped anti-reflection films 110 on a portion of the second textured surface of each respective grid-line area 102. A remaining portion of the second textured surface of each respective grid-line area 102 is not covered by any sheet-shaped anti-reflective films 110.

During production of the solar cell, the respective anti-reflection film on each grid-line area 102 is selectively etched, in order to expose a portion of the second textured surface of each grid-line area 102. The selective etching may be implemented by a laser treatment process, thereby removing at least a part of the respective anti-reflection film using laser etching, and the remaining parts of the respective anti-reflection film form the one or more sheet-shaped anti-reflection films 110. Gaps from which at least a part of the second textured surface of the respective grid-line area 102 is exposed are formed between adjacent sheet-shaped anti-reflection films 110.

The selective etching performed on the anti-reflection film may bring certain damage to the first textured surface, such that the surfaces of the corresponding first pyramid structures become uneven, thereby forming the respective second textured surface of each grid-line area 102. In this way, a surface of a respective one of the plurality of sheet-shaped anti-reflection films 110 facing towards the second textured surface includes a suspended region without contact with the second textured surface. By adjusting parameters of the laser or a number of repetitions of laser treatments, the one or more sheet-shaped anti-reflection films 110 whose suspended regions occupy more than 5% of the surface areas can be obtained.

In some embodiments, the selective etching also may be chemical etching.

Figure 12:
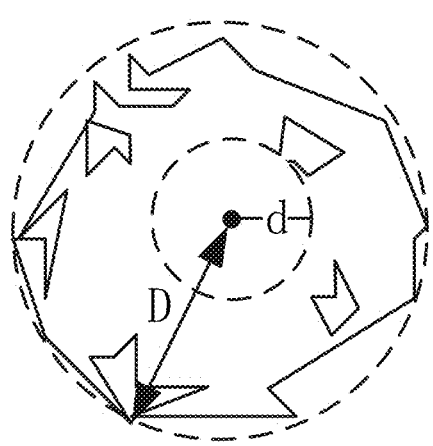
FIG. 12 is a schematic diagram of a laser spot according to some embodiments of the present disclosure.

Referring to FIGS. 8 to 12, in some embodiments, laser used in the laser treatment process forms a laser spot on the anti-reflection film, and a ratio of a size d of a center region of the laser spot to a size D of the laser spot ranges from 0.4 to 0.6 or from 0 to 0.1. FIG. 12 is a schematic diagram of the laser spot.

The size of the laser spot refers to a maximum distance D between a center of the laser spot and any point on a peripheral sheet-shaped anti-reflection film 110 formed by the laser, and the size of the center region of the laser spot refers to a distance d between the center of the laser spot and a closest sheet-shaped anti-reflection film 110. Taking a circular laser spot as an example, the size of the laser spot refers to a maximum distance D between a center of circle of the laser spot and any point on a most peripheral sheet-shaped anti-reflection film 110 formed by the laser, and the size of the center region of the laser spot refers to a minimum distance d between the center of circle of the laser spot and any point on a closest sheet-shaped anti-reflection film 110.

During the laser treatment process, equipment selection of the laser may be performed first. For example, a laser having Gaussian laser spot is selected for the laser treatment process. Then the moving velocity of the laser spot, the number of pulses used in a single treatment and laser frequency are determined, and gradient proofing is performed on a test substrate using different powers, in order to find out powers of the laser meeting the condition that the ratio of the size d of the center region of the laser spot to the size D of the laser spot ranges from 0.4 to 0.6 or from 0 to 0.1. The selective etching is then performed on the anti-reflection film on the substrate 100 based on the determined powers of the laser. In this way, the laser used in the laser treatment process has low powers, such that the plurality of sheet-shaped anti-reflection films 110 can be formed without excessively damaging the first textured surface, thereby reducing the damage on the substrate 100.

Herein, the test substrate and the substrate 100 have the same or similar materials and structures, and the test substrate also has the first textured surface and the anti-reflection film covering the first textured surface.

In some embodiments, the operation of performing the laser treatment process on the anti-reflection film includes: performing a plurality of laser treatments on the anti-reflection film using the laser, where the ratio of the size d of the center region of the laser spot to the size D of the laser spot ranges from 0 to 0.1.

When the ratio of the size d of the center region of the laser spot to the size D of the laser spot ranges from 0 to 0.1, the power of the laser is low, such that most of the formed plurality of sheet-shaped anti-reflection films 110 do not separate from each other after one laser treatment, few gaps are formed between adjacent sheet-shaped anti-reflection films 110, and the total exposed area of the substrate 100 cannot be effectively increased.

In view of this, when the ratio of the size d of the center region of the laser spot to the size D of the laser spot ranges from 0 to 0.1, a plurality of low-power laser treatments are performed repetitively on the anti-reflection film using the laser according to a respective pattern of each grid-line area 102, such as 2, 3, 4, 5, 6 or 7 laser treatments are performed. In this way, a plurality of sheet-shaped anti-reflection films 110 in a form of randomly distributed large blocks or in a form of uniformly distributed small blocks can be formed, and the area of the substrate exposed between adjacent sheet-shaped anti-reflection films 110 is large enough, thereby effectively increasing the exposed area of the substrate 100.

In some embodiments, few laser treatments are performed repetitively on the anti-reflection film, for example, 2 to 4 laser treatments are performed repetitively on the anti-reflection film. The formed sheet-shaped anti-reflection films 110 are uniformly distributed, and there are a large number of gaps between the formed sheet-shaped anti-reflection films 110. Moreover, damage on the pyramid structures is relatively low, thereby reducing the damage on the substrate 100.

In some embodiments, in the laser treatment process, a laser spot is formed on the anti-reflection film, and a center region of the laser spot has a size d, the laser spot has a moving velocity v, laser used in the laser treatment process has frequency f, and $0.8d<v/f<2d$.

As mentioned above, the size of the center region of the laser spot refers to a distance d between the center of the laser spot and a closest sheet-shaped anti-reflection film 110. After the equipment selection of the laser, the gradient proofing is performed on the test substrate using pre-determined laser power, the number of pulses used in a single treatment and laser frequency f, and during the gradient proofing, the moving velocity v of the laser spot is continuously adjusted, in order to find out the moving velocity v of the laser spot meeting the condition that $0.8d<v/f<2d$. Here the test substrate and the substrate 100 have the same or similar materials and structures, and the test substrate also has the first textured surface and the anti-reflection film covering the first textured surface. Then the selective laser etching is performed according to a preset respective pattern of each grid-line area 102 and using determined moving velocity v of the laser spot and the pre-determined laser power, the number of pulses used in a single treatment and the laser frequency f.

By setting the size d of the center region of the laser spot, the moving velocity v of the laser spot, and the laser frequency f to meet $0.8d<v/f<2d$, the anti-reflection film can be etched by utilizing the converging effect of the shape of the first textured surface and the anti-reflection film on the laser, such that one or more sheet-shaped anti-reflection films 110 are formed on a portion of the second textured surface of each grid-line area. In this way, the retention effect for the morphology of the pyramid structures in each grid-line area 102 can be improved, thereby reducing the damage on the substrate 100 and increasing the exposed area of the substrate 100.

Moreover, during the laser treatment process, the laser frequency f and/or the number of pulses used in a single treatment also may be adjusted. Based on the adjusted laser frequency f and/or the number of pulses used in a single treatment, the gradient proofing is performed on the test substrate again, and the moving velocity v of the laser spot is gradually adjusted during the gradient proofing, in order to find out a new moving velocity v of the laser spot meeting the condition that 0.8d<v/f<2d. Then the selective laser etching is performed using the updated parameters for the laser treatment process.

In some embodiments, after the one or more sheet-shaped anti-reflection films 110 are formed on the second textured surface of each grid-line area, the method further includes: performing deoxidation treatment on each grid-line area 102 using slow-release hydrofluoric acid with concentration of 0.3% to 20%.

After the laser treatment, oxide layers may be formed on the second textured surface of each grid-line area 102 and/or on the one or more sheet-shaped anti-reflection films 110, which may affect the photoelectric conversion efficiency of the solar cell. In view of this, after the one or more sheet-shaped anti-reflection films 110 are formed, deoxidation treatment is performed on each grid-line area 102 using slow-release hydrofluoric acid with concentration of 0.3% to 20%, such as the slow-release hydrofluoric acid with the concentration of 0.5%, 1%, 2.5%, 5%, 8%, 12.5%, 15%, 18%, or 19%, in order to eliminate the oxide layers on the surface of the substrate 100 formed by autoxidation and/or laser oxidation, thereby improving the photoelectric conversion efficiency of the solar cell.

In some embodiments, a duration of the deoxidation treatment ranges from 20 seconds to 90 seconds. The duration of the deoxidation treatment depends on concentration of the selected slow-release hydrofluoric acid, the power of laser used in the laser treatment process and therefore the thicknesses of the oxide layers formed on the surface of the substrate 100. When the duration of the deoxidation treatment is too long, the hydrofluoric acid may cause corrosion to the substrate 100 or the sheet-shaped anti-reflection films 110, thereby increasing the damage on the substrate 100 and affecting the structures and strength of the sheet-shaped anti-reflection films 110. When the duration of the deoxidation treatment is too short, the oxide layers may not be completely eliminated.

In view of this, the duration of the deoxidation treatment is set in a range of 20 seconds to 90 seconds, such as a duration of 22 s, 25 s, 30 s, 37.5 s, 45 s, 55 s, 60 s, 75 s, 85 s, or the like. In this way, the oxide layers formed on the surface of the substrate 100 can be effectively eliminated, and the damage on the substrate 100 and the sheet-shaped anti-reflection films 110 can be reduced.

Referring to FIGS. 1, 2, 8 and 11, a respective grid line 120 is formed on each grid-line area 102, where the respective grid line 120 is in contact with the second textured surface of each grid-line area 102 and with the one or more sheet-shaped anti-reflection films 110.

After forming the plurality of sheet-shaped anti-reflection films 110, a respective grid line 120 is formed on each grid-line area 102 using deposition or electroplating processes according to the position of each grid-line area 102, and the respective grid line 120 is in contact with the exposed second textured surface of each grid-line area 102 and with the one or more sheet-shaped anti-reflection films 110. By forming the one or more sheet-shaped anti-reflection films 110 on a portion of the second textured surface of each grid-line area 102 and exposing the remaining portion of the second textured surface of each grid-line area 102, the exposed portion of the second textured surface of each grid-line area 102 and the lateral surfaces of the one or more sheet-shaped anti-reflection films 110 can effectively increase the contact area of the respective grid line 120 with the substrate 100, and the one or more sheet-shaped anti-reflection films 110 can anchor the respective grid line 120, thereby improving the bonding strength between the respective grid line 120 and the substrate 100, reducing the probability of detachment of the respective grid line 120 from the substrate 100, and improving the reliability of the solar cell.

In some embodiments, each grid line 120 includes a plurality of plating layers stacked in sequence. For example, a first plating layer of a thickness of 0.3 µm to 1 µm may be formed on a respective grid-line area 102 using electroplating/chemical plating/chemical vapor deposition, and the first plating layer may completely cover the portion of the second textured surface exposing from the one or more sheet-shaped anti-reflection films 110. Then, a second and a third plating layers are sequentially grown using electroplating. The first plating layer may have 1 to 5 sub-layers as needed, and a total thickness of the second and third plating layers is greater than or equal to 4 µm. The total thickness of the second and third plating layers refers to a distance between a surface of the second plating layer facing towards the first plating layer and a surface of the third plating layer facing away from the first plating layer in a direction perpendicular to a surface of the first plating layer facing away from the substrate.

The details of the embodiments of the method for producing a solar cell are also applicable to the embodiments of the structures of the solar cell. Similarly, the details of the embodiments of the structures of the solar cell are also applicable to the embodiments of the method.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the claims.

What is claimed is:

1. A solar cell, comprising:
   a substrate, having a first textured surface, wherein the first textured surface has a plurality of first pyramid structures, and a plurality of grid-line areas spaced from each other are formed on the first textured surface, wherein the plurality of grid-line areas include first grid-line areas and second grid-line areas, and each grid-line area of the plurality of grid-line areas has a second textured surface;
   a plurality of sheet-shaped anti-reflection films, wherein one or more respective sheet-shaped anti-reflection films of the plurality of sheet-shaped anti-reflection films are formed on a portion of the second textured surface of each grid-line area of the first grid-line areas; and
   a plurality of grid lines, including first grid lines, wherein each grid line of the first grid lines is formed on a respective first grid-line area and is in contact with the one or more respective sheet-shaped anti-reflection films formed on a portion of the second textured surface of the respective first grid-line area and with a remaining portion of the second textured surface of the respective first grid-line area not covered by any sheet-shaped anti-reflection films;

wherein each sheet-shaped anti-reflection film of at least some of the plurality of sheet-shaped anti-reflection films has a respective inner surface facing a respective portion of the second textured surface of a corresponding first grid-line area, the respective inner surface includes a bonding region that is connected and in direct physical contact with the respective portion of the second textured surface of the corresponding first grid-line area and a suspended region that does not contact the second textured surface of the corresponding first grid-line area, and a portion of a grid line of the plurality of grid lines is formed in a gap between the suspended region and the second textured surface.

2. The solar cell according to claim 1, wherein each grid-line area of the first grid-line areas includes a first portion, a second portion and a third portion in sequence along a direction perpendicular to an extension direction of a first grid-line area, and the first portion, the second portion and the third portion each have a plurality of projected structures; and the one or more sheet-shaped anti-reflection films of the plurality of sheet-shaped anti-reflection films are formed on at least a part of the plurality of projected structures of the first portion and on at least a part of the plurality of projected structures of the third portion.

3. The solar cell according to claim 2, wherein no sheet-shaped anti-reflection film is formed on the plurality of projected structures of the second portion, and wherein the plurality of projected structures of the first portion and the plurality of projected structures of the third portion are second pyramid structures or pyramid-like structures, and the plurality of projected structures of the second portion are pine-cone structures.

4. The solar cell according to claim 2, wherein in a direction perpendicular to the first textured surface, a ratio of a height of a respective one of the plurality of projected structures of the second portion to a height of a respective one of the plurality of first pyramid structures of the first textured surface ranges from 0.3 to 0.9.

5. The solar cell according to claim 2, wherein the one or more sheet-shaped anti-reflection films of the plurality of sheet-shaped anti-reflection films are formed also on at least a part of the plurality of projected structures of the second portion.

6. The solar cell according to claim 5, wherein a largest size in any one dimension of a respective sheet-shaped anti-reflection film of the plurality of sheet-shaped anti-reflection films ranges from 0.3 μm to 6 μm.

7. The solar cell according to claim 6, wherein the largest size in any one dimension of the respective sheet-shaped anti-reflection film of the plurality of sheet-shaped anti-reflection films ranges from 2 μm to 6 μm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.4 to 0.9.

8. The solar cell according to claim 6, wherein the largest size in any one dimension of the respective sheet-shaped anti-reflection film of the plurality of sheet-shaped anti-reflection films ranges from 0.3 μm to 2 μm, and in a direction perpendicular to the first textured surface, a ratio of a height of a respective one of the plurality of projected structures of the first portion, or of the plurality of projected structures of the second portion, or of the plurality of projected structures of the third portion to a height of a respective one of the plurality of first pyramid structures of the first textured surface ranges from 0.6 to 1.

9. The solar cell according to claim 1, wherein the plurality of grid lines further include second grid lines, and each grid line of the second grid lines is formed on a respective second grid-line area and is in contact with the second textured surface of the respective second grid-line area.

10. The solar cell according to claim 1, wherein in a direction perpendicular to the respective inner surface, a distance between the suspended region and the second textured surface ranges from 50 nm to 1000 nm.

11. The solar cell according to claim 1, wherein a ratio of an area of the suspended region to an area of the respective inner surface ranges from 5% to 90%.

12. The solar cell according to claim 1, wherein the plurality of grid lines further include second grid lines, and at least one respective sheet-shaped anti-reflection film of the plurality of sheet-shaped anti-reflection films is formed on a portion of the second textured surface of each grid-line area of the second grid-line areas; and wherein each grid line of the second grid lines is formed on a respective second grid-line area and is in contact with the at least one respective sheet-shaped anti-reflection film formed on a portion of the second textured surface of the respective second grid-line area and with a remaining portion of the second textured surface of the respective second grid-line area not covered by any sheet-shaped anti-reflection films.

13. The solar cell according to claim 1, wherein a length of a lateral side of a respective one of the plurality of first pyramid structures ranges from 400 nm to 5 μm.

14. A method for producing a solar cell, comprising:

providing a substrate having a first textured surface, wherein the first textured surface has a plurality of first pyramid structures, and an anti-reflection film is formed on the first textured surface;

forming a plurality of grid-line areas spaced from each other and a plurality of sheet-shaped anti-reflection films, wherein the plurality of grid-line areas include first grid-line areas and second grid-line areas, and each grid-line area of the plurality of grid-line areas has a second textured surface, wherein one or more respective sheet-shaped anti-reflection films of the plurality of sheet-shaped anti-reflection films are formed on a portion of the second textured surface of each respective first grid-line area, and a remaining portion of the second textured surface of each respective first grid-line area is not covered by any sheet-shaped anti-reflective films; and forming a plurality of grid lines, wherein the plurality of grid lines include first grid lines, and each grid line of the first grid lines is formed on a respective first grid-line area and is in contact with the one or more respective sheet-shaped anti-reflection films formed on a portion of the second textured surface of the respective first grid-line area and with the remaining portion of the second textured surface of the respective first grid-line area not covered by any sheet-shaped anti-reflection films;

wherein each sheet-shaped anti-reflection film of at least some of the plurality of sheet-shaped anti-reflection films has a respective inner surface facing a respective portion of the second textured surface of a corresponding first grid-line area, the respective inner surface includes a bonding region that is connected and in direct physical contact with the respective portion of the second textured surface of the corresponding first grid-line area and a suspended region that does not contact the second textured surface of the corresponding first grid-line area, and a portion of a grid line of the plurality of grid lines is formed in a gap between the suspended region and the second textured surface.

15. The method according to claim 14, wherein the plurality of grid-line areas are formed by performing a laser treatment process on the anti-reflection film.

16. The method according to claim 15, wherein in the laser treatment process, a laser spot is formed on the anti-reflection film, and wherein a center region of the laser spot has a size d, the laser spot has a moving velocity v, laser used in the laser treatment process has frequency f, and 0.8d<v/f<2d.

17. The method according to claim 16, wherein the moving velocity v of the laser spot is determined by performing gradient proofing on a test substrate.

18. The method according to claim 15, wherein laser used in the laser treatment process forms a laser spot on the anti-reflection film, and wherein a ratio of a size of a center region of the laser spot to a size of the laser spot ranges from 0.4 to 0.6 or from 0 to 0.1.

19. The method according to claim 14, wherein the plurality of grid lines further include second grid lines, and each grid line of the second grid lines is formed on a respective second grid-line area and is in contact with the second textured surface of the respective second grid-line area.

20. The method according to claim 14, wherein the plurality of grid lines further include second grid lines, and at least one respective sheet-shaped anti-reflection film of the plurality of sheet-shaped anti-reflection films is formed on a portion of the second textured surface of each grid-line area of the second grid-line areas; and wherein each grid line of the second grid lines is formed on a respective second grid-line area and is in contact with the at least one respective sheet-shaped anti-reflection film formed on a portion of the second textured surface of the respective second grid-line area and with a remaining portion of the second textured surface of the respective second grid-line area not covered by any sheet-shaped anti-reflection films.

* * * * *